US007999357B1

United States Patent
Chan

(10) Patent No.: US 7,999,357 B1
(45) Date of Patent: Aug. 16, 2011

(54) ELECTROSTATIC DISCHARGE CIRCUIT USING FORWARD BIASED CIRCULAR-ARC SHAPED STEERING DIODES

(75) Inventor: Paul Chan, Cupertino, CA (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 125 days.

(21) Appl. No.: 12/464,805

(22) Filed: May 12, 2009

Related U.S. Application Data

(60) Provisional application No. 61/052,629, filed on May 12, 2008.

(51) Int. Cl.
*H01L 29/06* (2006.01)

(52) U.S. Cl. .......................................... 257/653; 361/54

(58) Field of Classification Search .......... 257/653–654; 361/54
See application file for complete search history.

(56) References Cited

U.S. PATENT DOCUMENTS

| | | | |
|---|---|---|---|
| 5,079,608 A * | 1/1992 | Wodarczyk et al. | .......... 257/355 |
| 5,446,302 A | 8/1995 | Beigel et al. | |
| 5,514,612 A | 5/1996 | Rao et al. | |
| 5,548,152 A | 8/1996 | Arai | |
| 5,594,266 A | 1/1997 | Beigel et al. | |
| 5,637,901 A | 6/1997 | Beigel et al. | |
| 5,770,886 A | 6/1998 | Rao et al. | |
| 5,877,534 A | 3/1999 | Williams et al. | |
| 6,320,232 B1 | 11/2001 | Gossner et al. | |
| 7,355,252 B2 | 4/2008 | Kim et al. | |
| 7,359,169 B2 | 4/2008 | Esmark et al. | |
| 7,362,554 B2 | 4/2008 | Austin et al. | |

* cited by examiner

*Primary Examiner* — Ha Tran T Nguyen
*Assistant Examiner* — Shaun Campbell
(74) *Attorney, Agent, or Firm* — Pillsbury Winthrop Shaw Pittman LLP

(57) ABSTRACT

The present invention advantageously provides a circular-arc shaped structure for forward biased steering diodes used in an ESD circuit, which circular arc shaped structure forward biases steering diodes effectively prevent concentration of an ESD pulse to one section of the p-n junction within the forward biased steering diode (or, alternatively viewed, evenly distributing stress along the entire p-n junction), thus increasing reliability of the ESD circuit, and also minimizing input capacitance as well as occupying a smaller area. The circular-arc shaped structure thus provides a mechanism to evenly distribute the current flow through the ESD steering diodes, and therefore avoids the disadvantage of a voltage gradient along the steering diode structure.

15 Claims, 10 Drawing Sheets

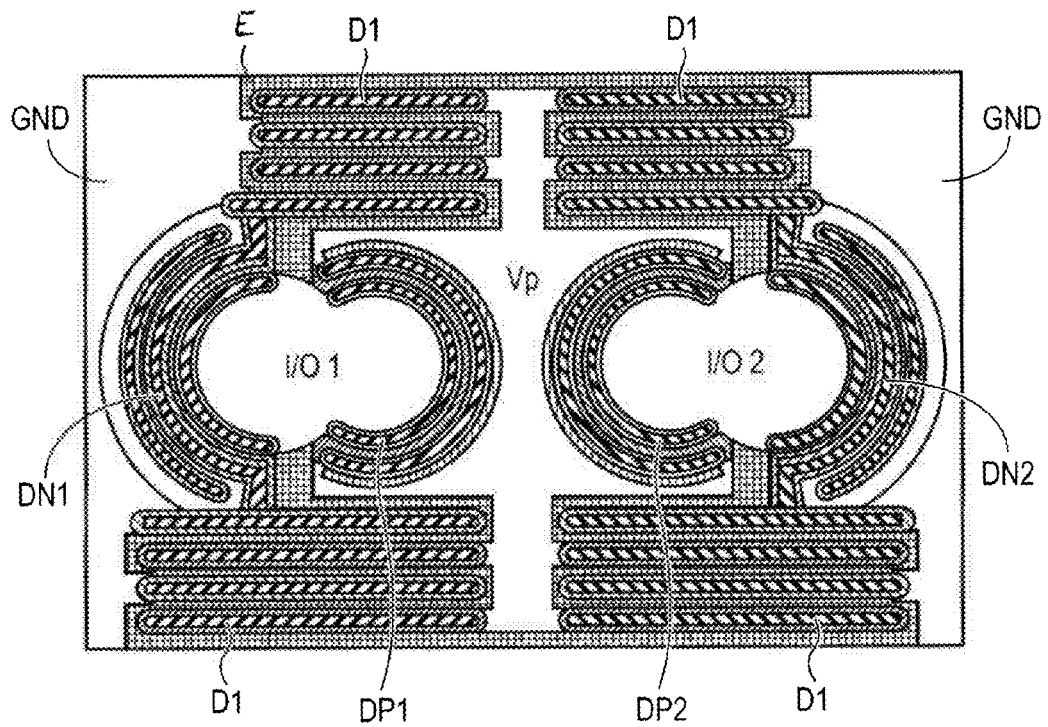
FIG. 4A1
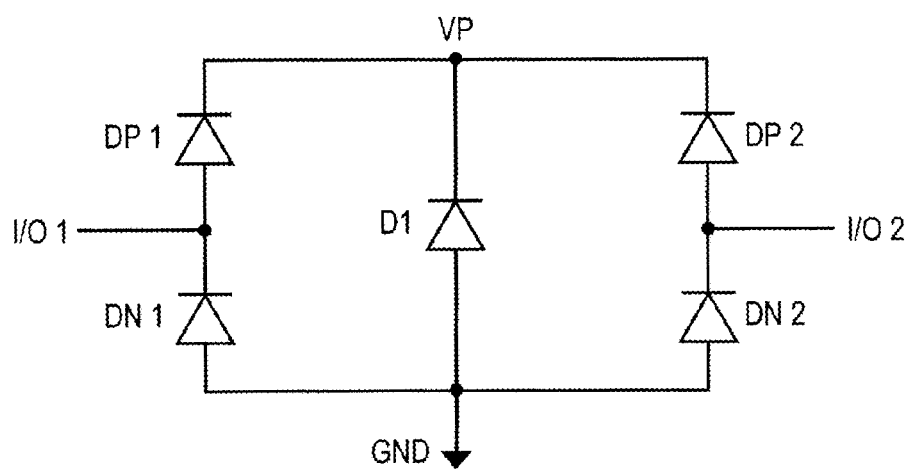
FIG. 4A2

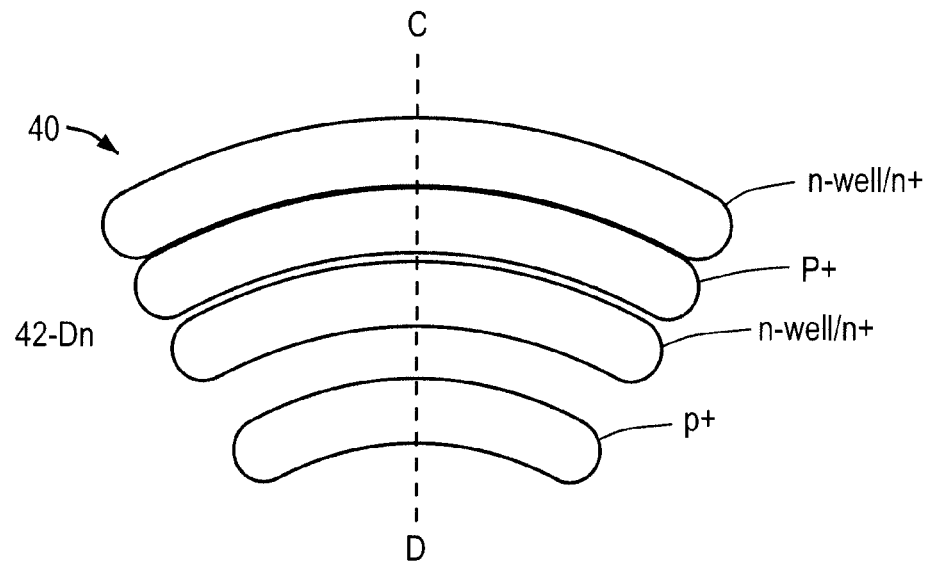
FIG. 5A1
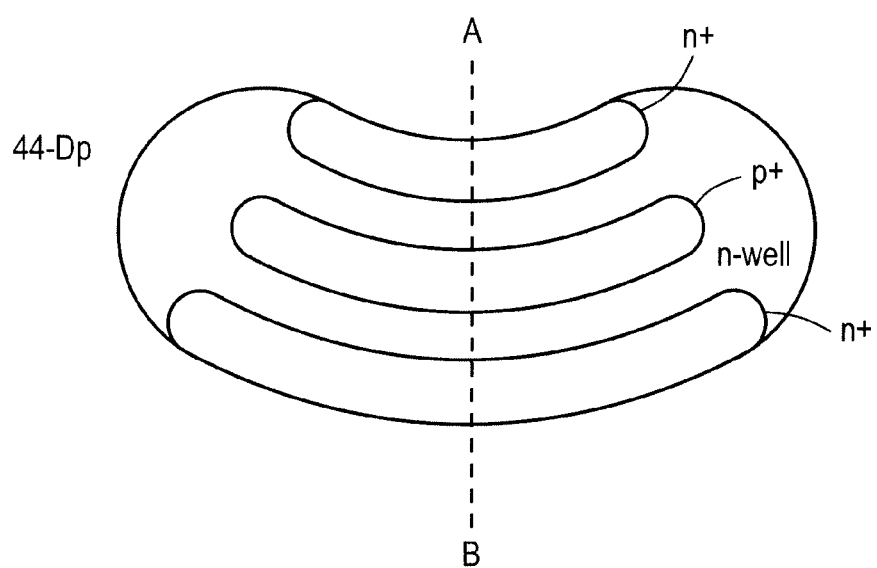
FIG. 5A2

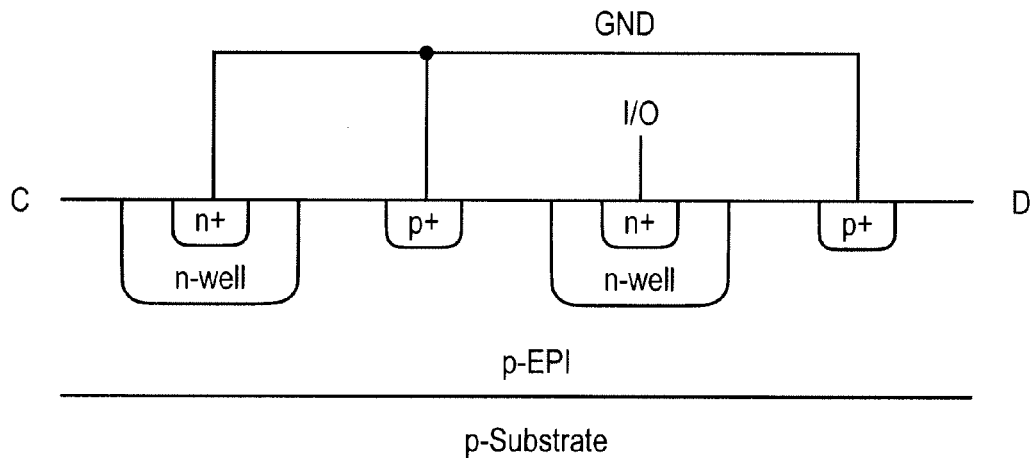
FIG. 5B1
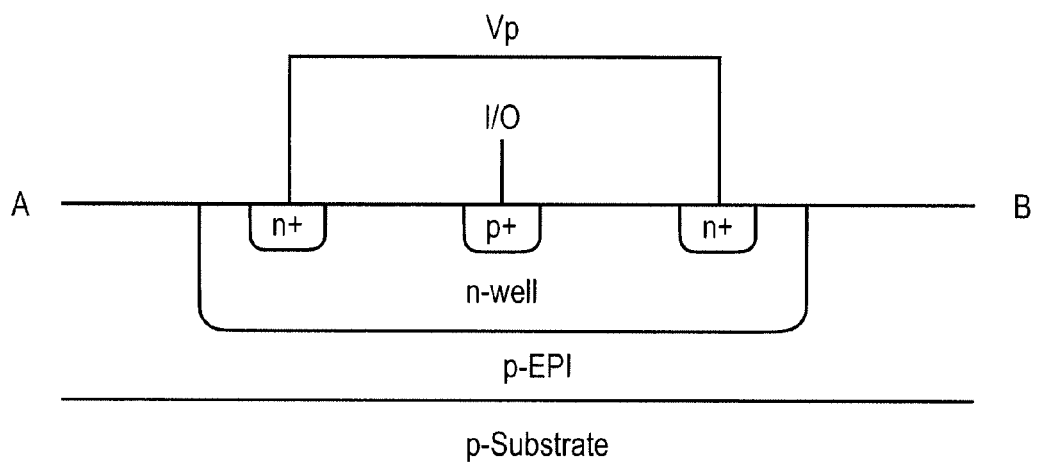
FIG. 5B2

ELECTROSTATIC DISCHARGE CIRCUIT USING FORWARD BIASED CIRCULAR-ARC SHAPED STEERING DIODES

This application claims priority to U.S. Provisional Application No. 61/052,629, filed May 12, 2008, entitled "Electrostatic Discharge Circuit Using Forward Biased Circular Shaped Steering Diodes", the contents of which are expressly incorporated by reference herein.

FIELD OF THE INVENTIONS

The present inventions relate to electrostatic discharge circuits, and particularly electrostatic discharge circuits using forward biased circular-arc shaped steering diodes.

BACKGROUND

Electrostatic discharge (ESD) is a well known phenomenon that must be taken into consideration during the design of many different types of circuits, such as processors, application specific integrated circuits, and the like. Essentially, when an ESD event occurs (typically in the form of a rapid pulse of undesired energy), the ESD circuit that is associated with the circuit is used to shunt the undesired energy away from the circuit to protect it.

An example of a known circuit that is used to provide ESD protection is illustrated in FIG. 1. As illustrates, there are two forward biased steering diodes Dn and Dp, where current from an ESD event that is negative will flow through Dn, whereas current from an ESD event that is positive will flow through Dp. With the current from an ESD event appropriately directed using the steering diodes, the current is then passed through a reverse biased sinker zener diode D1, which operates to provide a path to ground (sink) for the ESD pulse as a result of avalanche breakdown. The steering diodes Dn and Dp are choosen to minimize the effective capacitance of the entire ESD structure in this well known circuit topology illustrated in FIG. 1.

FIG. 2 illustrates a traditional layout of the steering diodes in the ESD circuit described in FIG. 1. In this traditional layout, at least one of the steering diodes (Dp in the example shown) is laid out in what is known as a fingered structure. This fingered structure has been used because it creates the maximum lateral area. As most of the current injection is lateral, the larger the lateral area, the more robust the structure. It has been found by the present inventor, however, that this fingered structure has the disadvantage of creating a voltage gradient which causes most of the ESD current to flow through a concentrated area 20 of the p-n junction of the steering diode Dp at each finger of the fingered layout structure as shown in FIG. 2. This concentration of current reduces the performance and reduces the reliability of the overall circuit.

Further, as voltages used in circuits generally have decreased, there has been a need for increasing ESD performance in the industry. However increasing ESD performance is associated with higher capacitance of the ESD device. For high speed signaling, increasing ESD capacitance is not acceptable, since it reduces the signal integrity of the system. Accordingly, there is a need for ESD circuits that can provide greater ESD protection with further reductions in input capacitance.

SUMMARY

The present invention advantageously provides a circular-arc shaped structure for forward biased steering diodes used in an ESD circuit, which circular-arc shaped structure forward biases steering diodes effectively prevent concentration of an ESD pulse to one section of the p-n junction within the forward biased steering diode (or, alternatively viewed, evenly distributing stress along the entire p-n junction), thus increasing reliability of the ESD circuit, and also minimizing input capacitance as well as occupying a smaller area. The circular-arc shaped structure thus provides a mechanism to evenly distribute the current flow through the ESD steering diodes, and therefore avoids the disadvantage of a voltage gradient along the steering diode structure.

BRIEF DESCRIPTION OF THE DRAWINGS

These and other aspects and features of the present inventions will become apparent to those of ordinary skill in the art upon review of the following description of specific embodiments of the invention in conjunction with the accompanying figures, wherein:

FIGS. 4(a)1 and 4(a)2 are a top view and a circuit view of the ESD circuit shown in FIG. 4(a).

FIGS. 5(a)-5(d) illustrate a two-metal layer ESD circuit with a circular arc-shaped structure according to an embodiment.

DETAILED DISCUSSION OF THE PREFERRED EMBODIMENTS

Figure 3A:
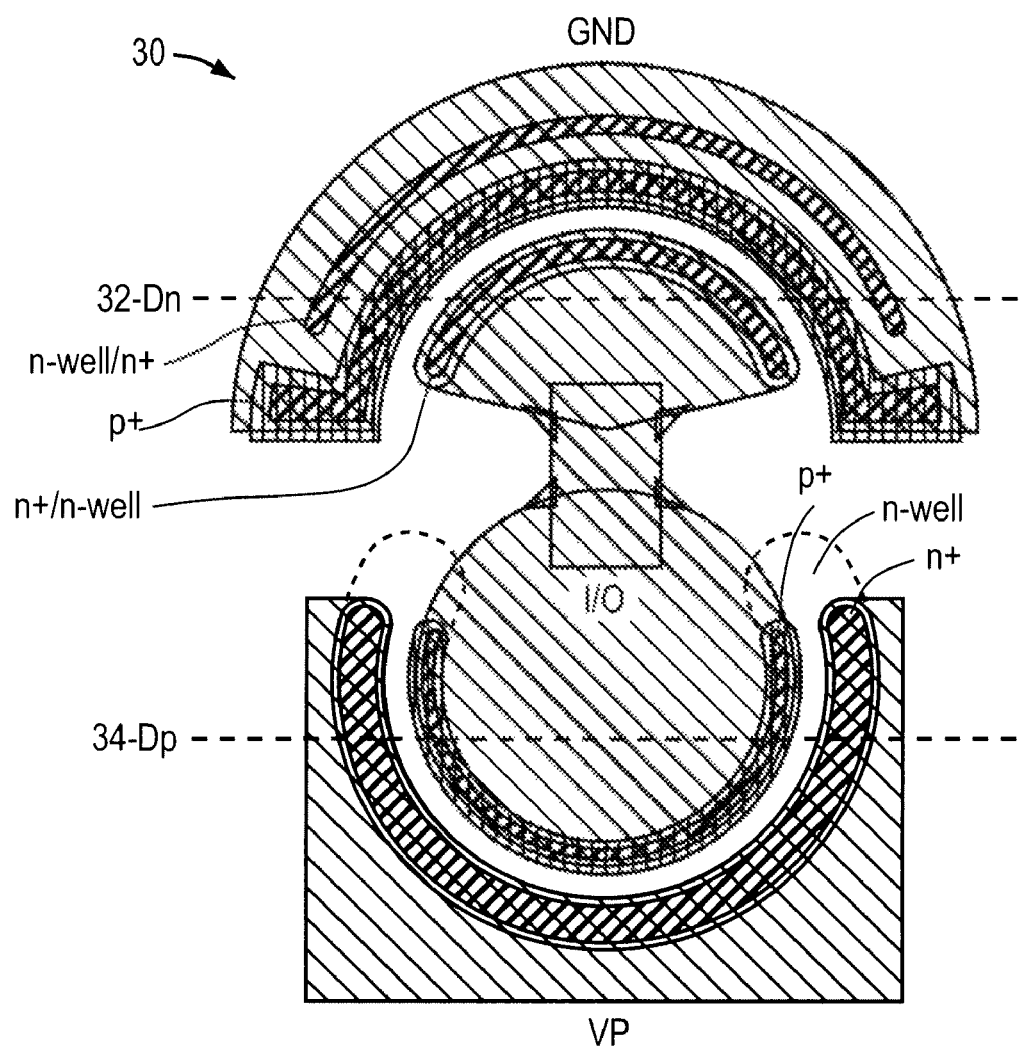
FIGS. 3(a) and 3(b) illustrate top view and cross sectional views (along the lines indicated in FIG. 3(a) of an ESD circuit with a circular arc-shaped structure according to an embodiment.
Figure 3B:
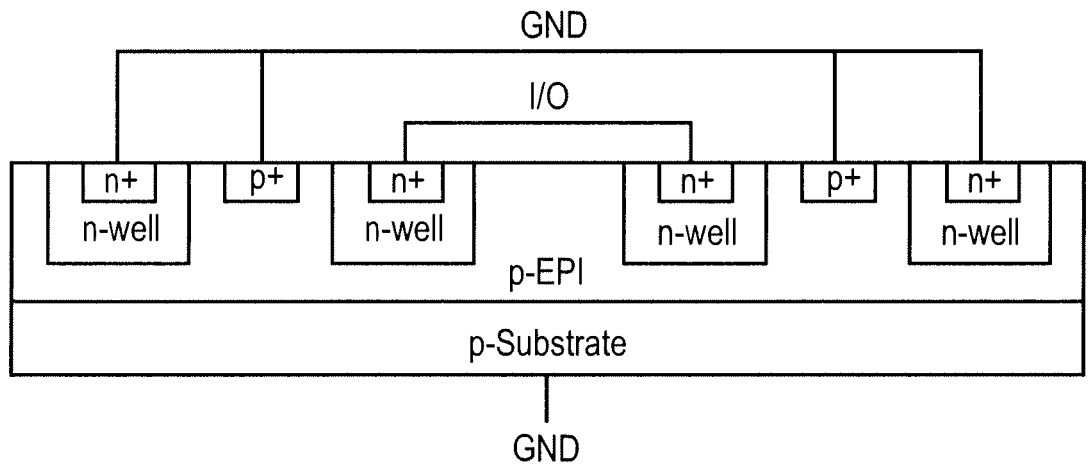
Figure 3B:
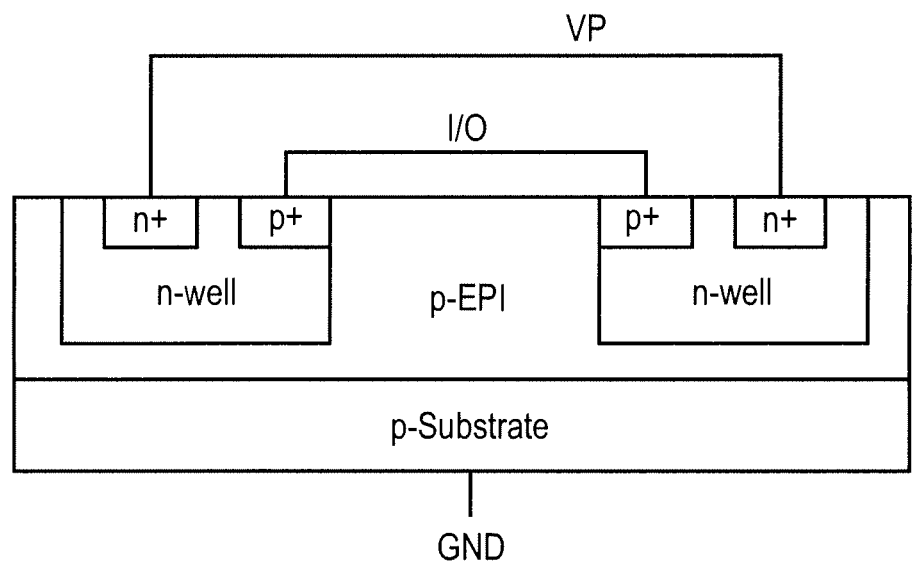

FIGS. 3(a) and 3(b) illustrate top view (which view does show components that are at different levels in order for relationships between these components to be understood) and cross sectional views (along the lines indicated in FIG. 3(a) of the ESD circuit 30 according to the present invention that also uses a layout that includes a circular-arc shaped structure for forward biased steering diodes 32Dn and 34Dp, within a single metal ESD circuit. It will be understood, as shown by the top view FIG. 3(a), that the substrate structures shown in FIG. 3(b) have an circular arced shape as shown, such that there is only two n-well regions associated with diode 32Dn, and only a single n-well region associated with diode 34Dp.

These circular-arc shaped structure forward biased steering diodes 32Dn and 34Dp effectively prevent concentration of an ESD pulse to one section of the p-n junction within the forward biased steering diodes 32Dn and 34Dp by evenly distributing stress along their entire p-n junction, thus increasing effectiveness of the ESD circuit, and also minimizing input capacitance.

Figure 1:
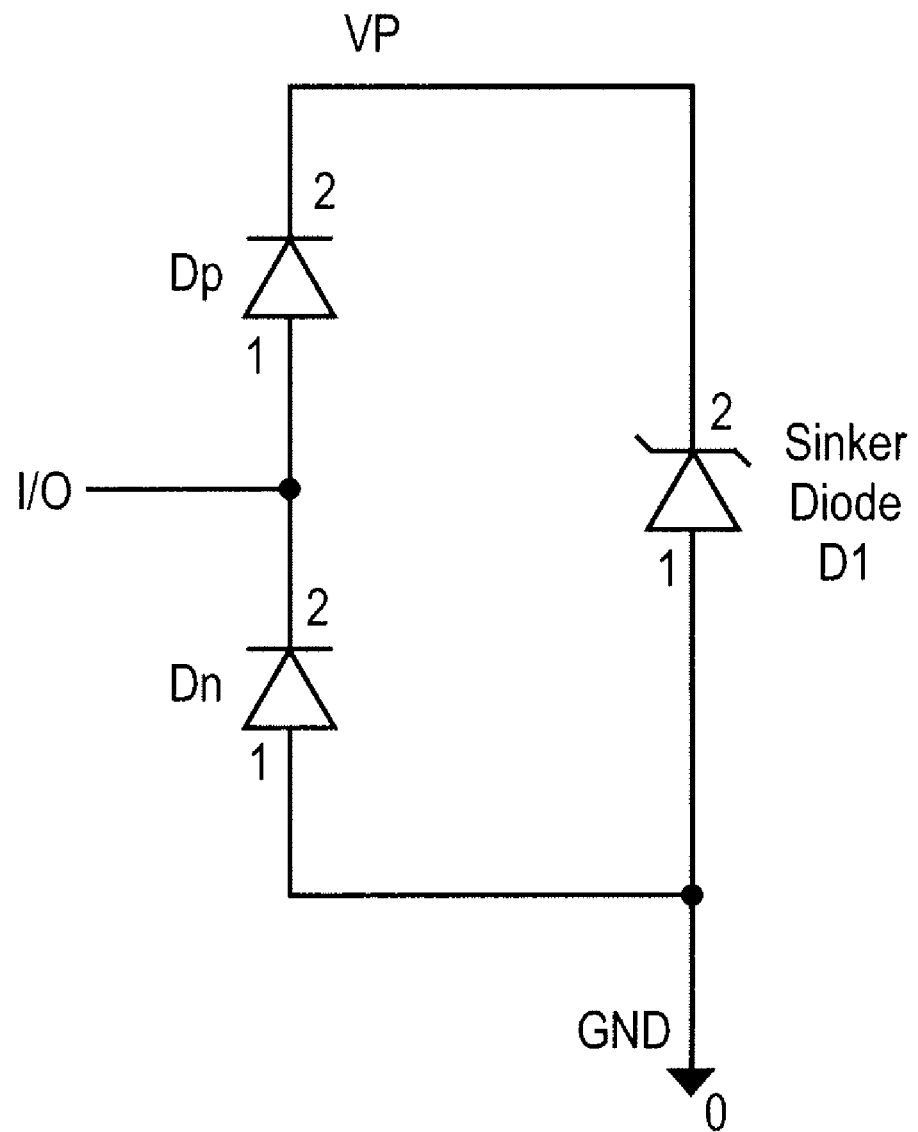
FIG. 1 illustrates a known circuit that is used to provide ESD protection.

As shown also by FIGS. 3(a) and 3(b), there is no voltage gradient along the p-n junction that results from usage of a circular-arc shaped layout structure for the bonding pad, which is apparent as the center of the bonding pad has an equal distance to any point along the p-n junctions of the forward biased steering diodes 32Dn and 34Dp—by creating a circular arc shaped concave outer surface of the bonding pad metal that abuts against the p-n junction of the forward biased steering diodes 32Dn and 34Dp, which advantageously provides for evenly distributed stress along the p-n junctions, and which maximizes the ESD robustness of the circuit 30. It is noted that the performance of the circuit 30, also shown in schematic view in FIG. 1, is significantly effected by the stress within the forward biased steering diodes 32Dn and 34Dp, and as such the circular arc shaped junctions reduce this stress as described. In contrast, the clamping diode D1 in FIG. 1 need not have a junction with a circular arc shape, but the junction can be in any shape to achieve maximum layout efficiency, such as a fingered structured layout of clamping diode D1 as shown in FIG. 4(a) and FIG. 4(a)1, as the stress on the clamping diode D1 will not be as heavy because part of the energy will be absorbed by the forward biased steering diode 34Dp from the voltage drop across it due to its series resistance; Vp (voltage to D1) will be lower than VI/O (Voltage at the I/O) and these two voltages affect the stress on the junctions to 34Dp and D1 respectively. Also, not all the current from Dp will flow to D1. From FIG. 3(b), Dp, besides acting as a p-n junction in series with D1, also forms a VERTICAL PNP to the substrate and this PNP is turned on during an ESD event which absorbs part of the current. The clamping diode D1 also doesn't contribute significantly to the overall capacitance of the circuit due to the fact that its capacitance is in series with and much larger than the capacitance of the steering diode 34Dp. Furthermore, since the clamping diode D1 provides for ESD protection, it can be used to protect a number of different I/O circuits at the same time, such as shown and described further herein with respect to FIGS. 4(a)1 and 4(a)2.

The circular-arc shaped p-n junction and correspondingly shaped bond pad structures described above provide the most effective distribution of stress along the p-n junction. While the amount of the arc can vary, having an equal distance from any point on the p-n junction to the center of the bonding pad is desirable.

In use, when the circuit 30 shown in FIGS. 1 and 3(a)-(b) according the present invention receives an ESD pulse, the initial energy, which is transmitted through the steering diodes 32Dn and 34Dp receive the energy and distribute it along substantially the entire p-n junction associated therewith. As a result, since the entire p-n junction is used, the stress is evenly distributed along the entire junction. Therefore, less junction area is needed as compared to the fingered structure resulting to a low input capacitance from smaller p-n junction area. Furthermore, given that there is less stress at any one point of the p-n junction, the device will not fail due to a particular stress point.

In an ESD event, the current will flow through either one of the steering diodes 32Dn or 34Dp as well as the clamping diode D1, also referred to as a zener diode in the art. The clamping diode D1 will provide an effective clamp to protect the steering diode 34Dp by limiting the peak voltage on both the anode and cathode of the steering diode 34Dp.

Figure 2:
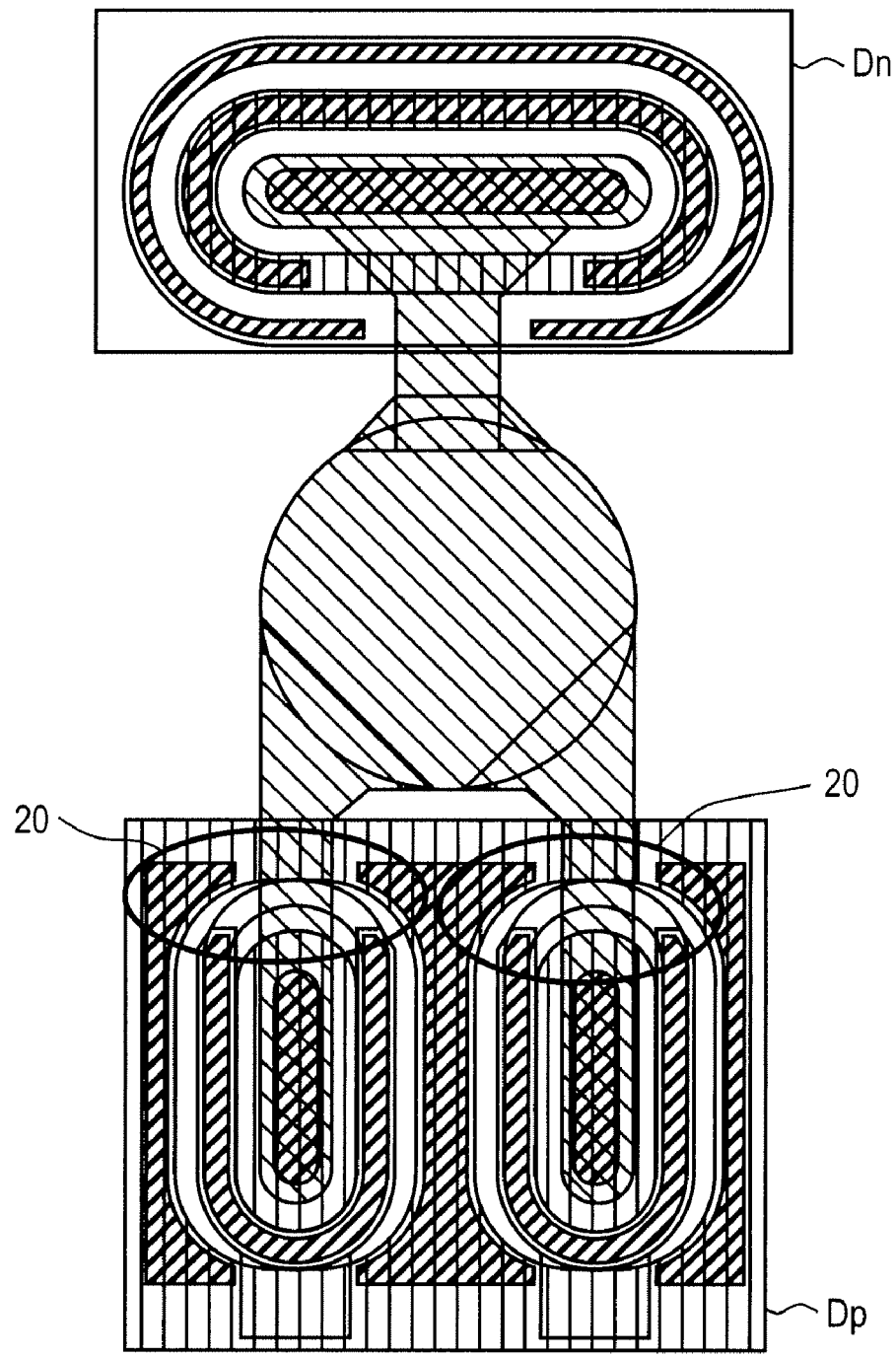
FIG. 2 illustrates a traditional layout of the steering diodes in the ESD circuit described in FIG. 1.
Figure 4B:
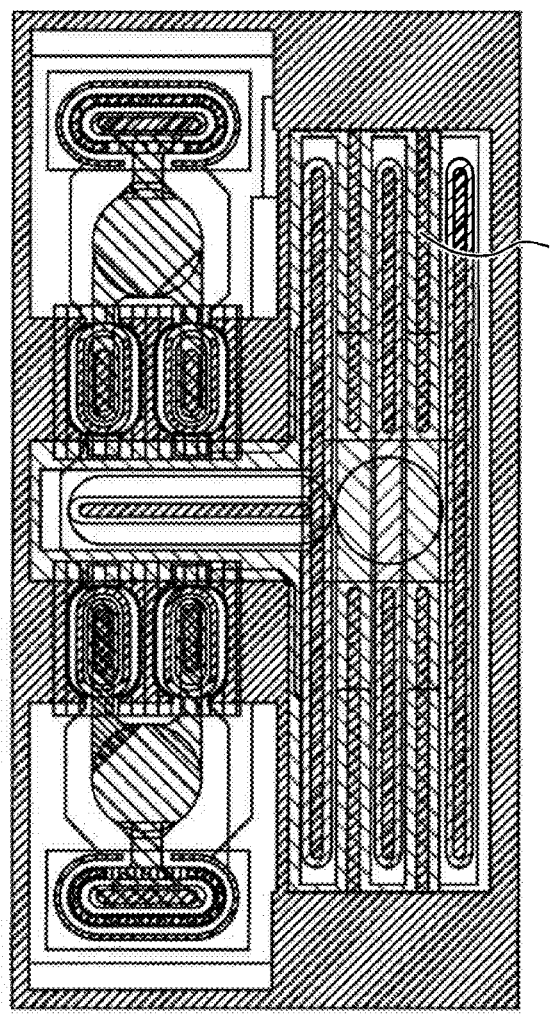
FIGS. 4(a) and 4(b) are correspondingly size-accurate top views of ESD circuits according to an embodiment and a conventional finger pattern implementation, respectively, that shows relative area savings according to the embodiment.
Figure 4A:
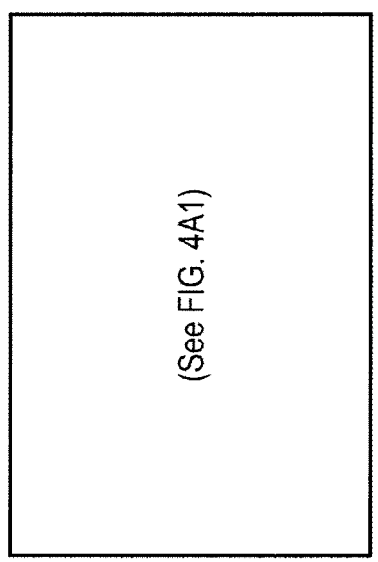

As is apparent from FIGS. 4(a) and 4(b), which are correspondingly size-accurate top views (which views show components that are at different levels in order for relationships between these components to be understood) of ESD circuits according to an embodiment of the present invention and a circuit equivalent conventional finger pattern implementations, respectively, which have comparable ESD performance. As is apparent, there is a significant area saving in layout, so that there can be a lower die cost and the die can be assembled in smaller package. This FIG. 4(a) embodiment, shown in more detail in FIG. 4(a)1 and as a circuit implementation as shown in FIG. 4(a)2 also illustrate other advantages. In particular, since the clamping diode D1 provides for ESD protection, it can be used to protect a number of different I/O circuits at the same time, such as shown and described, as is apparent the steering diode pairs Dp1/Dn1 and Dp2/Dn2 each operate together with a related input output, shown as I/O-1 and I/O-2, respectively, yet share together the same clamping diode D1, as most easily shown in the FIG. 4(a)2 schematic view. As shown in the FIG. 4(a)1 top view, the clamping diode D1, while a single structure, can be laid out in a distributed area, in this case having roughly ¼ of the area on different edges of the two different I/O bonding pads I/O-1 and I/O-2. While a fingered structure for the clamping diode D1 is shown here, other types of layouts are within the spirit and scope of the invention. For purposes of clarification, it is noted that the cross hatched area, for convenience of reference noted with an "E" is an insulator marked with this cross hatch to distinguish the different conductor areas I/O 1, I/O 2, GND and VP that are shown in white.

Figure 5C:
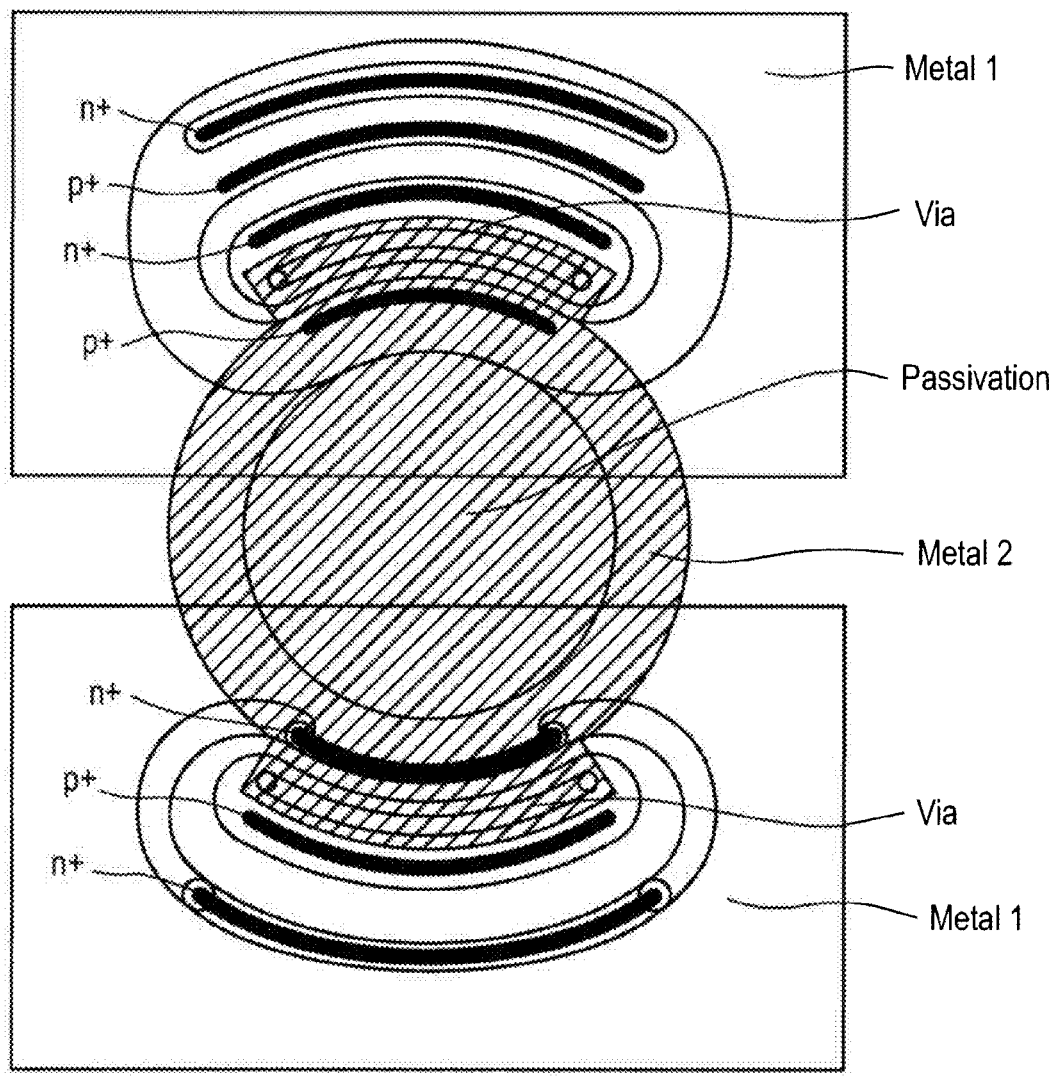
Figure 5D:
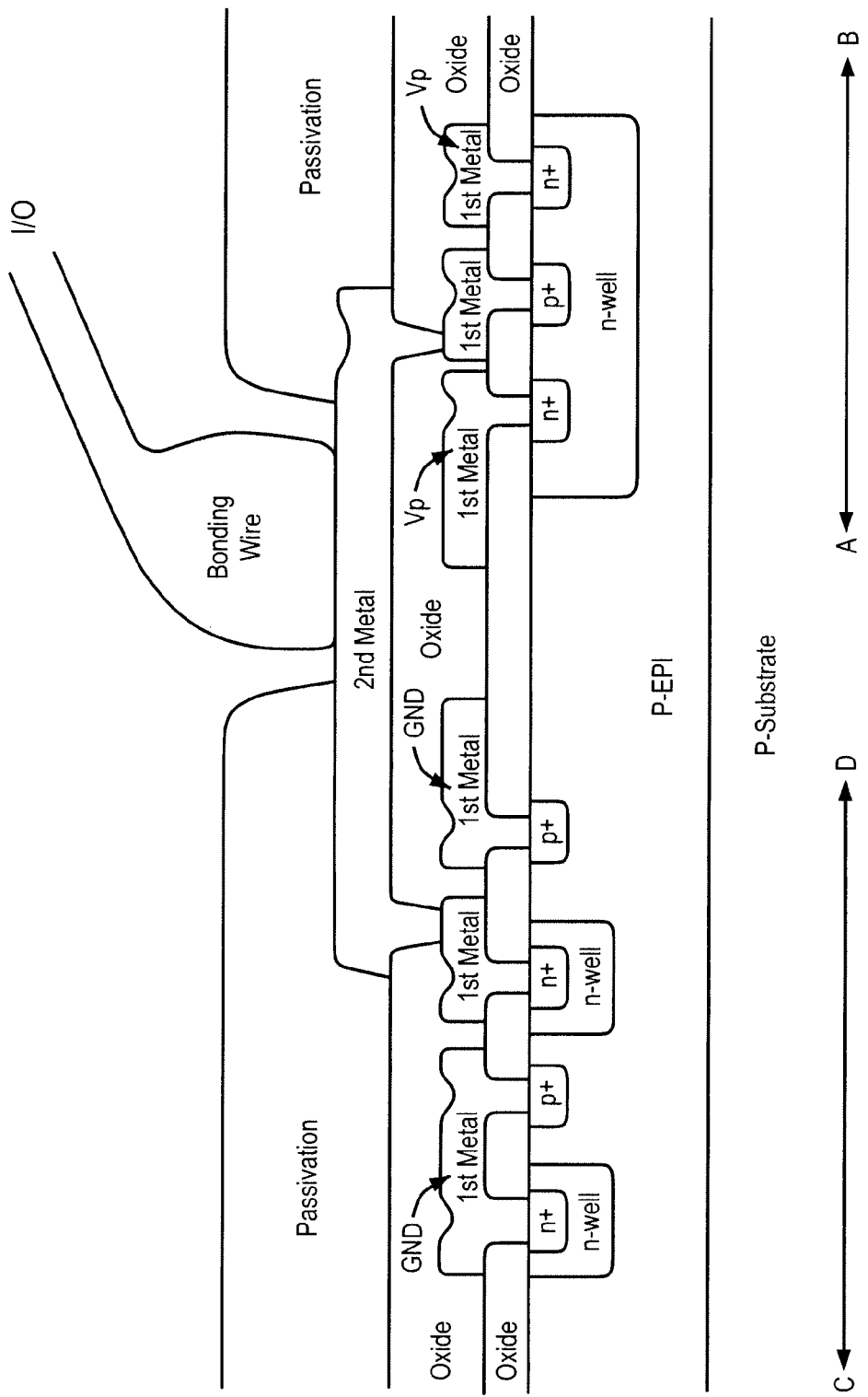

FIGS. 5(a)-5(d) illustrate a two-metal layer ESD circuit 40 with a circular arc-shaped structure according to an embodiment. FIGS. 5(a) and 5(b) illustrate top substrate view and cross sectional substrate views (along the lines indicated in FIG. 5(a)) of an embodiment for a two metal layer of the ESD circuit 40 according to the present invention, which embodiment also uses a layout that includes a circular-arc shaped structure for forward biased steering diodes 42Dn and 44Dp, within the 2-layer metal ESD circuit. It will be understood, as shown by the top views of FIG. 5(a) (which shows a semiconductor top view) and 5(c) (which view show components that are at different levels in order for relationships between these components to be understood) and the side cross-sections views of FIGS. 5(b) and 5(d) that with a 2-layer metal available layout, the p+ region of forward biased steering diode 44Dp is able to fully utilize both sides of it's lateral junctions to distribute the ESD energy because n+ regions are available on both sides of the p+junctions. Therefore, less p+ region area is needed to absorb the same ESD energy, resulting in lower junction capacitance, and hence lower input capacitance.

These circular arc shaped structures forward biased steering diodes 42Dn and 44Dp effectively prevent concentration of an ESD pulse to one section of the p-n junction within the forward biased steering diode by evenly distributing stress along the entire p-n junction, thus increasing effectiveness of the ESD circuit, and also minimizing input capacitance.

As shown also by FIGS. 5(a) and 5(c), there is no voltage gradient along the p-n junction that results from usage of a circular layout structure, which is apparent as the center of the bonding pad has equal distance to any point along the p-n junction—thereby creating a circular arc shaped outer surface of the bonding pad metal that abuts against the p-n junction, which advantageously provides for evenly distributed stress along the junction, which maximizes its ESD robustness. The Table below is a chart of exemplary values usable for the above-described embodiments shown in FIGS. 3(a)-(b) and FIGS. 5(a)-(d), respectively, as well as performance based thereon.

TABLE 1

|  | one-level metal 1.5 u contact width | two-level metal 1.5 u contact width P+ to N+ spacing = 8.5 u |
|---|---|---|
| Top Diode Area (P+) | 547 | 247 |
| Top Diode Peripheral Area (P+) | 218 | 112 |
| Bottom Diode Area (N-well) | 900 | 409 |
| Bottom Diode Peripheral Area (P+)—Effective | 371 | 112 |
| PARASITICS |  |  |
| Metal-to-Sub capacitance (ouside diffusion) | 3896 | 4743 |
| Top diode junction capacitance (P+/N-well) | 0.276 | 0.129 |
| Bottom diode junction capacitance (N-well/Sub) | 0.113 | 0.046 |
| Parasitic (Metal/Sub) | 0.105 | 0.064 |
| Total Capacitance—power on | 0.494 | 0.240 |
| ESD Performance | 14 kV | 11 kV |

It is also noted that for the various different embodiments described above, the various semiconductor layers, dopant regions, metal layers, as well as insulation and electrical connections shown in the Figures can be fabricated using conventional semiconductor fabrication techniques, and as such a detailed fabrication description is not provided herein.

Although the present invention has been particularly described with reference to embodiments thereof, it should be readily apparent to those of ordinary skill in the art that various changes, modifications and substitutes are intended within the form and details thereof, without departing from the spirit and scope of the invention. Accordingly, it will be appreciated that in numerous instances some features of the invention will be employed without a corresponding use of other features. Further, those skilled in the art will understand that variations can be made in the number and arrangement of components illustrated in the above figures. It is intended that the scope of the appended claims include such changes and modifications.

What is claimed is:

1. An apparatus for dissipating an ESD pulse to ground, the ESD pulse being one of a positive ESD event and a negative ESD event, the apparatus comprising:
   an integrated circuit, the integrated circuit including thereon:
      a conductive input pad, the conductive input pad having first and second circular arc shaped sections, wherein first and second circular arc shaped sections include corresponding first and second circular arc shaped concave outer surfaces;
      a ground line adapted for connection to ground;
      first and second forward biased steering diodes, the first and second forward biased steering diodes each electrically connected to the respective first and second circular arc shaped concave outer surface of the conductive input pad, wherein the first forward biased steering diode is adapted to steer the ESD pulse from the positive ESD event and wherein the second forward biased steering diode is adapted to steer the ESD pulse from the negative ESD event; wherein a p-n junction in each of the first and second forward biased steering diodes conforms in shape to the first and second circular arc-shaped concave outer surfaces, respectively, and wherein each of the first and second circular arc-shaped concave outer surfaces abuts the p-n junction in the first and second forward biased steering diodes, respectively; and
      a reverse biased clamping diode connected between the first forward biased steering diode and the ground line and adapted for providing a ground path to the ground line for the ESD pulse.

2. The apparatus according to claim 1 wherein:
   the integrated circuit includes a p-type substrate and a p-type epitaxial layer;
   wherein the first forward biased steering diode is formed from a p-type material formed within an n-type material well, and the n-type material well formed within the p-type epitaxial layer, wherein the p-type material and the n-type material well both have a shape corresponding to the first circular arc-shaped concave outer surface; and
   wherein the second forward biased steering diode is formed from a n-type material formed within the p-type epitaxial layer, wherein the n-type material has a shape corresponding to the second circular arc-shaped concave outer surface.

3. An apparatus for dissipating an ESD pulse to ground, the ESD pulse being one of a positive ESD event and a negative ESD event, the apparatus comprising an integrated circuit, the integrated circuit including thereon:
   a p-type substrate and a p-type epitaxial layer;
   a conductive input pad, the conductive input pad having first and second circular arc shaped concave outer surfaces;
   a ground line adapted for connection to ground;
   first and second forward biased steering diodes, the first and second forward biased steering diodes each electrically connected to the respective first and second circular arc shaped concave outer surface of the conductive input pad, wherein the first forward biased steering diode is adapted to steer the ESD pulse from the positive ESD event and wherein the second forward biased steering diode is adapted to steer the ESD pulse from the negative ESD event; and further wherein a p-n junction in each of the first and second forward biased steering diodes conforms in shape to the first and second circular arc-shaped concave outer surfaces, respectively; and
   a reverse biased clamping diode connected between the first forward biased steering diode and the ground line and adapted for providing a ground path to the ground line for the ESD pulse, wherein the reverse biased clamping diode has a finger-shape structure
   a voltage positive line that connects the first forward biased steering diode to the reverse biased clamping diode, wherein the voltage positive line is electrically connected to an n+ material disposed within a p-type material well; and
   wherein the first forward biased steering diode is formed from a p-type material formed within an n-type material well, and the n-type material well formed within the p-type epitaxial layer, wherein the p-type material and the n-type material well both have a shape corresponding to the first circular arc-shaped concave outer surface, and
   wherein the second forward biased steering diode is formed from an n-type material formed within the p-type epitaxial layer, wherein the n-type material has a shape corresponding to the second circular arc-shaped concave outer surface,
   wherein the reverse biased clamping diode has a finger-shape structure, and
   wherein the ground line includes a voltage negative line that connects the second forward biased steering diode to the reverse biased clamping diode, wherein the voltage negative line is electrically connected to another n-type material disposed within the p-type epitaxial layer, a portion of the voltage negative line and the another n-type material both having a shape corresponding to the second circular arc shaped concave outer surface.

4. The apparatus according to claim 3 further including p+ material disposed within the p-type epitaxial layer between the n-type material and the another n-type material, wherein the p+ material is electrically connected to the voltage negative line and having a shape corresponding to the second circular arc shaped concave outer surface.

5. The apparatus according to claim 3 wherein the ground line and the voltage positive line are made using an integrated circuit having a single metal layer.

6. The apparatus according to claim 1 wherein the first and second circular arc shaped concave outer surfaces are formed from an intersection of two circles, at non-intersecting portions of each of the two circles.

7. The apparatus according to claim 1 further including a voltage positive line connecting the first forward biased steering diode to the reverse biased clamping diode, and wherein the ground line and the voltage positive line are made using an integrated circuit having a single metal layer.

8. The apparatus according to claim 1 wherein the first forward biased steering diodes contains a p+ region disposed in an n-well, and between n+ regions also disposed within the n-well;

further including a voltage positive line connecting the first forward biased steering diode to the reverse biased clamping diode, and wherein the ground line and the voltage positive line are made using an integrated circuit having two metal layers.

9. An apparatus for dissipating an ESD pulse to ground, the ESD pulse being one of a positive ESD event and a negative ESD event, the apparatus comprising an integrated circuit, the integrated circuit including thereon:

a conductive input pad, the conductive input pad having first and second circular arc shaped concave outer surfaces;

a ground line adapted for connection to ground;

first and second forward biased steering diodes, the first and second forward biased steering diodes each electrically connected to the respective first and second circular arc shaped concave outer surface of the conductive input pad, wherein the first forward biased steering diode is adapted to steer the ESD pulse from the positive ESD event and wherein the second forward biased steering diode is adapted to steer the ESD pulse from the negative ESD event; and further wherein a p-n junction in each of the first and second forward biased steering diodes conforms in shape to the first and second circular arc-shaped concave outer surfaces, respectively;

a reverse biased clamping diode connected between the first forward biased steering diode and the ground line and adapted for providing a ground path to the ground line for the ESD pulse;

another conductive input pad, the another conductive input pad having third and fourth circular arc shaped concave outer surfaces; and third and fourth forward biased steering diodes, the third and fourth forward biased steering diodes each electrically connected to the respective third and fourth circular arc shaped concave outer surface of the another conductive input pad, wherein the third forward biased steering diode is adapted to steer the ESD pulse from the positive ESD event and wherein the fourth forward biased steering diode is adapted to steer the ESD pulse from the negative ESD event; and further wherein another p-n junction in each of the third and fourth forward biased steering diodes conforms in shape to the third and fourth circular arc-shaped concave outer surfaces, respectively; and wherein the third and fourth forward biased steering diodes are electrically connected to the reverse biased clamping diode.

10. The apparatus according to claim 9 wherein the third and fourth circular arc shaped concave outer surfaces are formed from an intersection of two circles, at non-intersecting portions of each of the two circles.

11. The apparatus according to claim 9 wherein the reverse biased clamping diode has a distributed layout on opposite sides of the conductive input pad and the another conductive input pad.

12. The apparatus according to claim 11 wherein the distributed layout is a fingered structure:

a voltage positive line that connects the first forward biased steering diode to the reverse biased clamping diode, wherein the voltage positive line is electrically connected to an n+ material disposed within a p-type material well; and wherein the ground line includes a voltage negative line that connects the second forward biased steering diode to the reverse biased clamping diode, wherein the voltage negative line is electrically connected to another n-type material disposed within the p-type epitaxial layer, a portion of the voltage negative line and the another n-type material both having a shape corresponding to the second circular arc shaped concave outer surface.

13. The apparatus according to claim 1, and further comprising a voltage positive line that connects the first forward biased steering diode to the reverse biased clamping diode, wherein the voltage positive line is electrically connected to an n+material disposed within a p-type material well.

14. The apparatus according to claim 1, wherein the ground line includes a voltage negative line that connects the second forward biased steering diode to the reverse biased clamping diode, wherein the voltage negative line is electrically connected to another n-type material disposed within the p-type epitaxial layer, a portion of the voltage negative line and the another n-type material both having a shape corresponding to the second circular arc shaped concave outer surface.

15. The apparatus according to claim 1, wherein the reverse biased clamping diode has a finger-shape structure.

* * * * *